United States Patent [19]

Lickel et al.

[11] 4,172,269
[45] Oct. 23, 1979

[54] CIRCUIT FOR OVERSHOOT SUPRESSION IN X-RAY GENERATORS

[75] Inventors: Kenneth F. Lickel, Cheshire; Roger Stonebank, Huntington, both of Conn.

[73] Assignee: North American Philips Corporation, New York, N.Y.

[21] Appl. No.: 862,007

[22] Filed: Dec. 19, 1977

[51] Int. Cl.² .............................................. H02H 7/20
[52] U.S. Cl. ..................................... 361/58; 361/111; 361/83
[58] Field of Search ................... 361/58, 111, 110, 91, 361/6, 7, 9, 10, 11, 20, 21, 29, 28, 31, 198, 83, 86, 87; 323/54, 62, 66, 67; 307/134, 135

[56] References Cited

U.S. PATENT DOCUMENTS

| | | | |
|---|---|---|---|
| 3,211,929 | 10/1965 | Prines et al. | 361/58 X |
| 3,374,421 | 3/1968 | Ringelman | 361/58 X |
| 3,505,591 | 4/1970 | Scott | 323/54 X |
| 3,529,210 | 9/1970 | Ito et al. | 361/58 |
| 3,590,319 | 6/1971 | Baltensperger | 361/10 X |
| 3,935,527 | 1/1976 | Michelet et al. | 361/58 X |
| 4,036,199 | 7/1977 | Chateau | 361/91 |
| 4,062,051 | 12/1977 | Way | 361/10 X |

*Primary Examiner*—Patrick R. Salce
*Attorney, Agent, or Firm*—Thomas A. Briody; Edward J. Connors, Jr.; Jack E. Haken

[57] ABSTRACT

Transient voltage overshoot is known to occur when primary current in a multi-phase X-ray generator high voltage transformer is switched on. Transient overshoot is supressed by connecting an impedance in series with the primary current switch. A second switch short circuits the series impedance after a time delay whose length is controlled as a direct function of the primary voltage and as an inverse function of the primary current.

The secondary switch and time delay circuits may comprise self-powered modules which may be added to the primary circuits of existing X-ray generators without additional sensing or power supply connections.

6 Claims, 2 Drawing Figures

CIRCUIT FOR OVERSHOOT SUPRESSION IN X-RAY GENERATORS

This invention relates to power supply circuits. More specifically this invention relates to circuits for supressing switch-on transients in the high voltage power supply of an X-ray generator.

BACKGROUND OF THE INVENTION

High voltage generators for X-ray tube power supplies may comprise a multi-phase high voltage transformer which provides power for application to an X-ray tube cathode and anode. In typical prior art circuits an AC voltage adjusting device, for example an autotransformer, supplies line power to the multi-phase primary of a high voltage transformer. A switching device, for example a silicon controlled rectifier (SCR) in conjunction with a bridge rectifier, opens and closes the star point of the multi-phase primary to turn on and turn off high voltage at the X-ray tube. Inductive and capacitive effects in the transformer and associated power supply components generally cause the high voltage to rise above its steady-state level during a period immediately following completion of the circuit. The severity of this overshoot is known to increase with increasing X-ray tube voltage and to decrease with increasing X-ray tube current.

Turn on voltage overshoot in prior art X-ray generator circuits has been suppressed by the use of damping resistors. The use of such resistors is expensive both in terms of equipment cost and power consumption. Furthermore, the specific values of damping resistors used in a given X-ray generator must be tailored to the circuit parameters of that generator so that separate design and circuit production is required for each distinct generator circuit. The addition of overshoot supressing components to existing X-ray generators has, additionally, generally required the use of separate additional power supply circuits to operate active components in the overshoot supression addition and control lines to supply preset voltage and current information to the supression delay timer.

SUMMARY OF THE INVENTION

In accordance with the present invention turn on voltage overshoot transients are supressed by switchably connecting an impedance in series with the high voltage primary switch of an X-ray generator and switchably removing said impedance from said circuit after a time delay which is suitable to provide transient supression.

In a typical circuit of the present invention the high voltage power supply of an X-ray generator includes a high voltage supply transformer, voltage adjusting means connected between the primary of said supply transformer and a power line source, first switch means connected to make and interrupt current flow from said source through said primary, an impedance connected in series with said first switch means, second switch means connected in parallel with said series impedance, and control means connected to control said second switch means which function to assure that said second switch means are open as said first switch means are closed whereby the impedance is connected in series with said first switch means and to close said second switch means after a computed time delay following the closing of said first switch means whereby said series impedance is removed from said circuit.

In a specific embodiment of the invention the time delay is computed to increase with increasing primary voltage and to decrease within increasing primary current.

A specific embodiment of the circuit which is suitable for use as an add-on modification kit in existing X-ray generators, comprises a programmable unijunction transistor circuit wherein the threshold voltage of the unijunction transistor is controlled by the primary voltage and discharge RC circuit is charged from a voltage determined by transformer primary current. The kit is powered directly from the transformer primary and does not require separate power supplies. Voltage and current are sensed in the transformer primary circuit so that separate switch contacts or sensing lines to the secondary are not required.

Typically, the series impedance is a resistance which is approximately equal to one half the effective system impedance in the transformer primary circuit.

It is, therefore, an object of this invention to provide circuit means for supressing turn-on voltage transients in an X-ray generator high voltage power supply.

Another object of this invention is to provide a transient supression circuit for X-ray voltage generator power supplies which may be added to existing power supply units without the addition of further power supply units without the addition of further voltage and current sensing means.

BRIEF DESCRIPTION OF THE DRAWINGS

The invention may be better understood from the following description of a preferred embodiment taken in connection with the appended drawings in which.

DESCRIPTION OF THE PREFERRED EMBODIMENT

Figure 1:
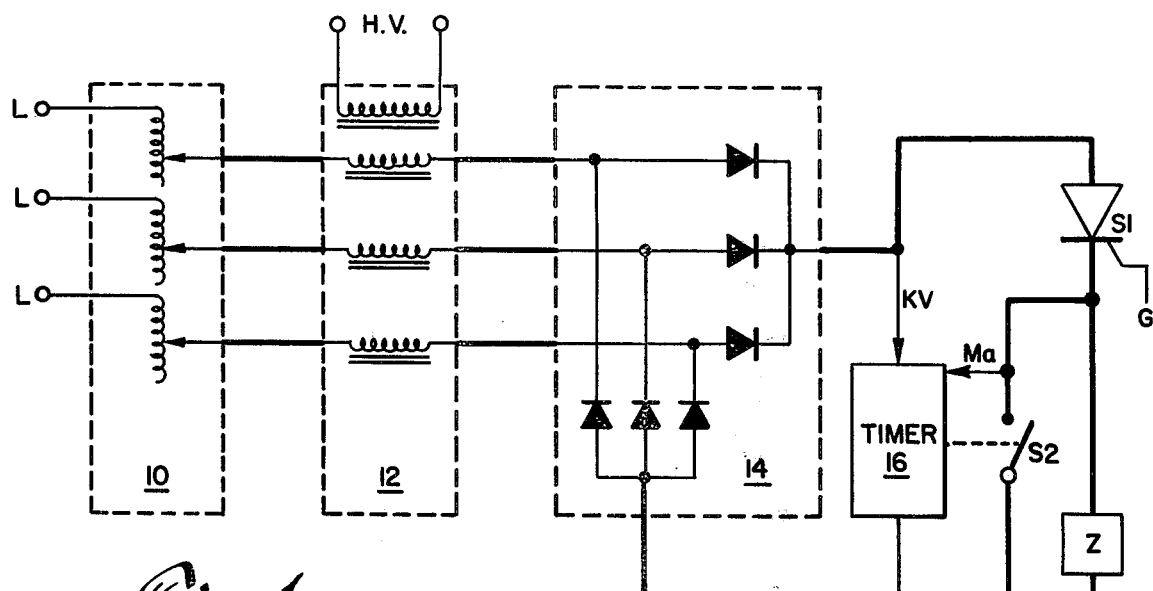
FIG. 1 is the high voltage power supply of an X-ray generator in accordance with the present invention.

FIG. 1 is a typical power supply for the high voltage circuit in an X-ray generator. In accordance with the prior art, line power from three phase line terminals L is supplied to voltage adjusting means, for example a three phase autotransformer 10, which allows adjustment of the generator high voltage level. The output of the autotransformer is connected to the three phase primary windings of a power supply high voltage transformer 12. The high voltage transformer 12 provides an output via the high voltage winding terminals H.V., (which may be a single or multi-phase high voltage secondary winding), which is rectified, filtered and supplied to the X-ray tube in accordance with known circuit configurations of the prior art. The input of a multi-phase bridge rectifier circuit 14 is connected in series with the three phase primary winding of the transformer 12. A switching element, typically a silicon controlled rectifier S1 is connected in series with the direct current output of the bridge rectifier 14. Switching on of the silicon controlled rectifier S1 via the gate circuit G completes the primary star point connection of the high voltage transformer 12 and thus permits current flow in the primary and secondary circuits. The foregoing circuit description is typical of prior art X-ray high voltage generators.

In accordance with the present invention a series impedance Z is connected in series with the silicon control rectifier S1. Second switch means S2 are connected in shunt with the impedance Z so that the impedance Z is effectively included in the circuit when the second switch means S2 are open and is removed from the circuit when the second switch means S2 are closed. The switch means S2 are controlled by a timer circuit 16 which functions to open the switch means S2 when current flow is blocked through the silicon control rectifier S1 and to close the switch means S2 after a computed time delay following the turn on of the SCR S1. The impedance Z is thus inserted in series with the transformer primary circuit for a time interval during which the most severe turn on transient overshoot effects occur and is removed from the transformer primary circuit after those transient effects subside and steady-state circuit conditions are reached. The time delay produced by the timer circuit 16 is determined, in a manner more specifically described below, by a computer circuit which increases the time delay in proportion to the voltage produced by the autotransformer 10 and applied to the transformer primary windings (as sensed at the output of the bridge rectifier on line KV) and in inverse proportion current flow in transformer primary circuit (as sensed across the impedance Z on line Ma).

A transient supression circuit which comprises the timer 16 the secondary switch S2 and the impedance Z may be added to existing prior art high voltage generator circuits in modular kit form. A specific embodiment of the circuit described with reference to FIG. 2 derives its entire power supply from the lines KV and Ma and thus does not require auxiliary power supply circuits for operation of the timer 16 or the switch S2.

Figure 2:
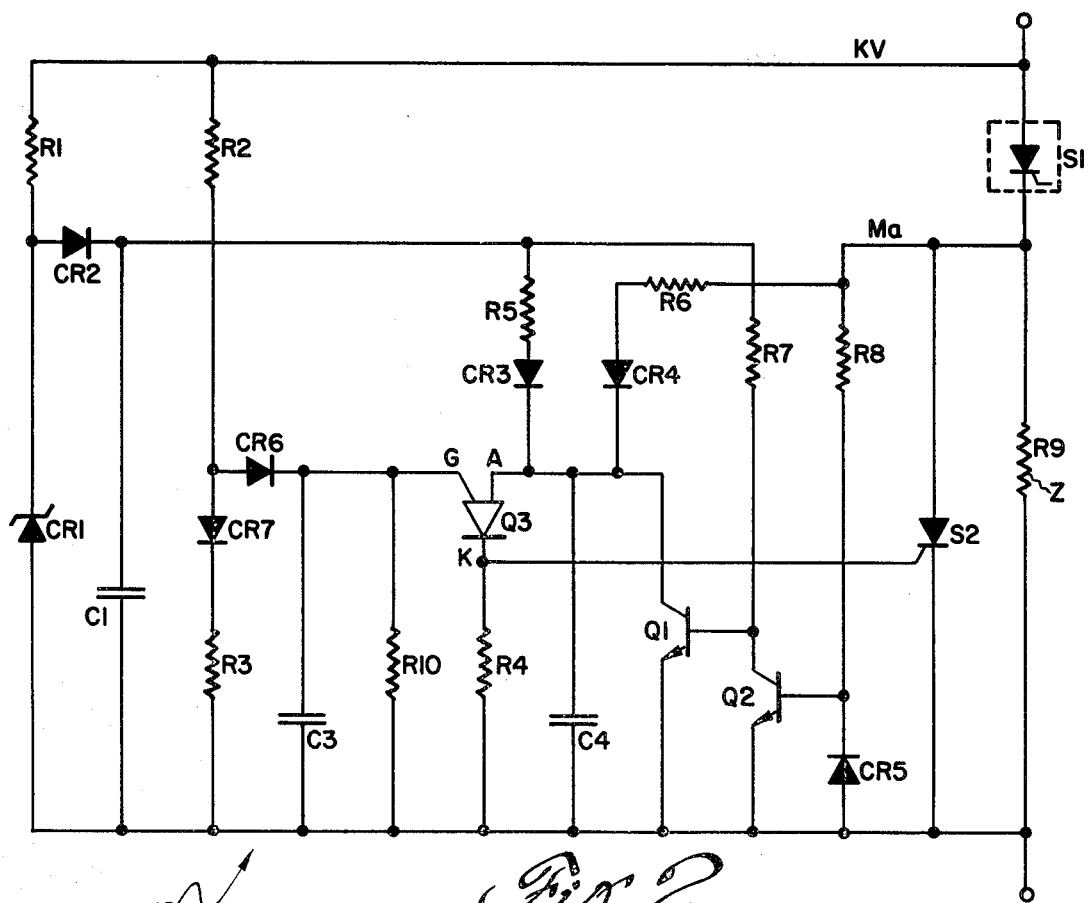
FIG. 2 is a transient supression timer circuit in accordance with the present invention which is exclusively connected to the high voltage transformer primary.

FIG. 2 is a specific embodiment of the timer circuit 16 and switch S2 of the present invention which comprises a programmable unijunction transistor and which is powered directly from the transformer primary circuit via the line KV.

Power from the anode of the SCR S1 is transmitted through line KV to a regulated power supply comprising dropping resistor R1 zener diode CR1 and rectifier CR2 in conjunction with filter capicator C1. Regulated voltage thus derived is supplied to the anode of a unijunction transistor Q3 through an OR-gate comprising resistor R5 and rectifier CR3 and to the collector of amplifier transistor Q2 through resistor R7.

A signal from the line KV is divided and peak detected in a circuit consisting of resistor R2 and R3, rectifiers CR6 and CR7, capacitor C3 and resistor R10 and is then applied to the gate of the programmable unijunction transistor Q3 to control its threshold voltage. A signal proportional to the transformer primary current is derived across the impedance Z on line Ma and utilized to charge capacitor C4 through resistor R6 and rectifier CR4. When the voltage on capacitor C4, at the anode of the programmable unijunction transistor Q3, exceeds the unijunction transistor gate voltage the equivalent anode to cathode resistance of the unijunction transistor abruptly drops and the pulse thus produced across the resistor R4 and the gate of the silicon controlled rectifier S2 forces the silicon controlled rectifier S2 into conduction, shunting the impedance Z and effectively removing it from the circuit. Voltage on line Ma also causes current flow into the base of transistor Q2 through resistor R8 which biases transistor Q1 in an off condition. When SCR S2 conducts, transistor Q2 is turned off; turning on transistor Q1 and discharging capacitor C4 to return the circuit to its original condition. The time delay between the turn on of SCR S1 and the turn on of SCR S2 thus increases in proportion the voltage on line KV, which is proportional to the transformer primary voltage, and in inverse proportion to the voltage at line Ma, which is proportional to the transformer primary current. The circuit of FIG. 2 thus functions to insert the overshoot limiting resistor Z in the circuit for an optimum time to supress the overshoot with minimum excess power dissipation or circuit disturbance.

As an example and to enable others to more easily practice the invention; in a typical circuit for use with a model MM100C X-ray generator manufactured by Philips Medical Systems, Incorporated of Shelton, Conn. and having a power output from 40 to 150 kilovolts and from 10 milliamps to 1,200 milliamps derived from three phase 440 volt power lines; the value of circuit components in FIG. 2 is as follows: R1 35 K $\Omega$ 50 watt; R2 820 K $\Omega$ 2 watt; R3 22.1 K $\Omega$; R4 K $\Omega$; R5 82.5 K $\Omega$; R6 100 K $\Omega$ 2 watt; R7 68 K $\Omega$; R8 10 K $\Omega$ 2 watt; R10 200 K $\Omega$; Z 0.375 $\Omega$ 50 watt; C1 10 $\mu f$ in parallel with 0001 $\mu f$ C3 0.1 $\mu f$; and CR1 20 volt zener diode. Q3 may, for example, be 2N6027 programmable unijunction transistor. The delay times produced by the circuit vary from approximately 1 milisecond to approximately 2 miliseconds depending on the values of primary voltage and current.

The circuit of the present invention allows transient voltage supression in X-ray generator circuits and allows installation as a separate modular kit without separate external power supply and signal connections.

We claim:

1. A high voltage power supply circuit comprising:
   a high voltage supply transformer;
   voltage adjusting means connected between the primary of said power supply transformer and a power line source;
   first switch means connected to make and interrupt current flow from said source through the primary of said transformer;
   a series impedance connected in series with said first switch means;
   second switch means connected in parallel with said impedance; and
   control means connected to operate said second switch means which control means function to assure that said second switch means are open as said first switch means are closed whereby said series impedance is connected in series with said first switch means and to close said second switch means after a computed time delay following closing of said first switch means whereby said series impedance is removed from said circuit, said time delay being computed as a function directly proportional to the voltage applied to said primary and in inverse proportion to the current flow through said primary.

2. The circuit of claim 1 wherein said second switch means is a semiconductor switch.

3. The circuit of claim 2 wherein said control means comprise a programmable unijunction transistor connected to fire said semiconductor switch;
   integrating means connected to integrate the voltage developed across said series impedance and to apply said integrated voltage to the anode of said programmable unijunction transistor;

means to detect the voltage developed across the series combination of said first switch means and said impedance and to apply a signal derived therefrom to the gate of said programmable unijunction transistor; and means to discharge said integrating means when said second switch means is conducting.

4. The circuit of claim 3 wherein the power source for said control means is derived from voltage developed across the series combination of said first switch means and said series impedance.

5. The circuit of claim 1 wherein the value of said series impedance is approximately equal to one half of the power supply impedance which is reflected in said primary of said transformer.

6. A circuit module for supressing turn-on voltage overshoot in high voltage power supplies of the type wherein a first switch closes to complete a current path through the primary of a high voltage transformer comprising a series impedance for connection in series with said first switch;

a second switch connected to shunt said series impedance;

programmable unijunction transistor timing means connected to close said second switch as the voltage on a capacitor reaches a programmed threshold voltage;

means for programming said threshold voltage in proportion to the peak voltage developed across the series combination of said first switch and said series impedance; and means for charging said capacitor at a rate proportional to the voltage developed across said series impedance.

* * * * *